(12) United States Patent
Han et al.

(10) Patent No.: US 7,027,551 B2
(45) Date of Patent: Apr. 11, 2006

(54) SHIFT REGISTER

(75) Inventors: Sang-Soo Han, Gwachun-shi (KR); Kyoung-Moon Lim, Gwangmyung-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/878,305

(22) Filed: Jun. 29, 2004

(65) Prior Publication Data

US 2005/0018807 A1    Jan. 27, 2005

(30) Foreign Application Priority Data

Jul. 24, 2003  (KR) .................... 10-2003-0050892

(51) Int. Cl.
*G11C 19/00* (2006.01)

(52) U.S. Cl. .......................... 377/69; 377/79

(58) Field of Classification Search ............... 345/99, 345/100; 377/69, 79
See application file for complete search history.

(56) References Cited

U.S. PATENT DOCUMENTS 5,859,630 A * 1/1999 Huq .......................... 345/100
6,760,005 B1 * 7/2004 Koyama et al. ............. 345/98

* cited by examiner

*Primary Examiner*—Tuan T. Lam
(74) *Attorney, Agent, or Firm*—McKenna Long & Aldridge LLP

(57) ABSTRACT

A shift register having a simple configuration and improved response and power consumption is disclosed. In the shift register, a plurality of stages are connected to each other in cascade and scanned in a bilateral direction. In the stages, a charger charges a first supply voltage into a first node in response to a clock signal. A discharger discharges the first node in response to a first start pulse or a second start pulse. A scan direction controller is connected between the charger and the discharger to discharge the first node into a different path in response to a scan direction control signal. An output part outputs any one of said first and second supply voltages as an output signal in response to a voltage at the first node. A latch part latches said output signal using said output signal and a clock signal inverted from said clock signal to feed back the latched output signal to the first node.

17 Claims, 7 Drawing Sheets

SHIFT REGISTER

This application claims the benefit of Korean Patent Application No. P2003-50892 filed in Korea on Jul. 24, 2003, which is hereby incorporated by reference for all purposes as if fully set forth herein.

BACKGROUND OF THE INVENTION

1. Field of the Invention

This invention relates to a shift register, and more particularly to a static shift register having a simple configuration as well as a bilateral characteristic.

2. Description of the Related Art

Flat panel display devices, such as a liquid crystal displays (LCD), electro-luminescence (EL) display devices, and plasma display panels (PDP), etc. have replaced a cathode ray tube (CRT) in many applications.

The LCD devices control the transmittance of light input from a light source using the dielectric anisotropy of the liquid crystal in accordance with an electric field, to display a picture. The EL display device, by contrast, emits light from a phosphorescent material using a re-combination of electrons with holes to display a picture.

Such LCD and EL display devices use a thin film transistor as a switching device for each picture element in order to provide an active matrix. The thin film transistor typically uses amorphous silicon or polycrystalline silicon as a semiconductor layer.

The amorphous silicon thin film transistor has an advantage of a stable characteristic according to the high uniformity of amorphous silicon film, but has a drawback of low electric charge mobility. This allows an amorphous silicon thin film transistor to be unsuitable for a high-resolution display device due to its low response time. It has a further disadvantage of high manufacturing cost because separately manufactured driving circuits requiring a high-speed response must be attached onto the display panel.

On the other hand, the polycrystalline silicon thin film transistor is suitable for use in a high-resolution display device because of its high electric charge mobility, and has an advantage of a lower manufacturing cost because driving circuits can be built on a display panel. Accordingly, LCD and EL display devices employing a polycrystalline silicon thin film transistor have been developed.

Figure 1:
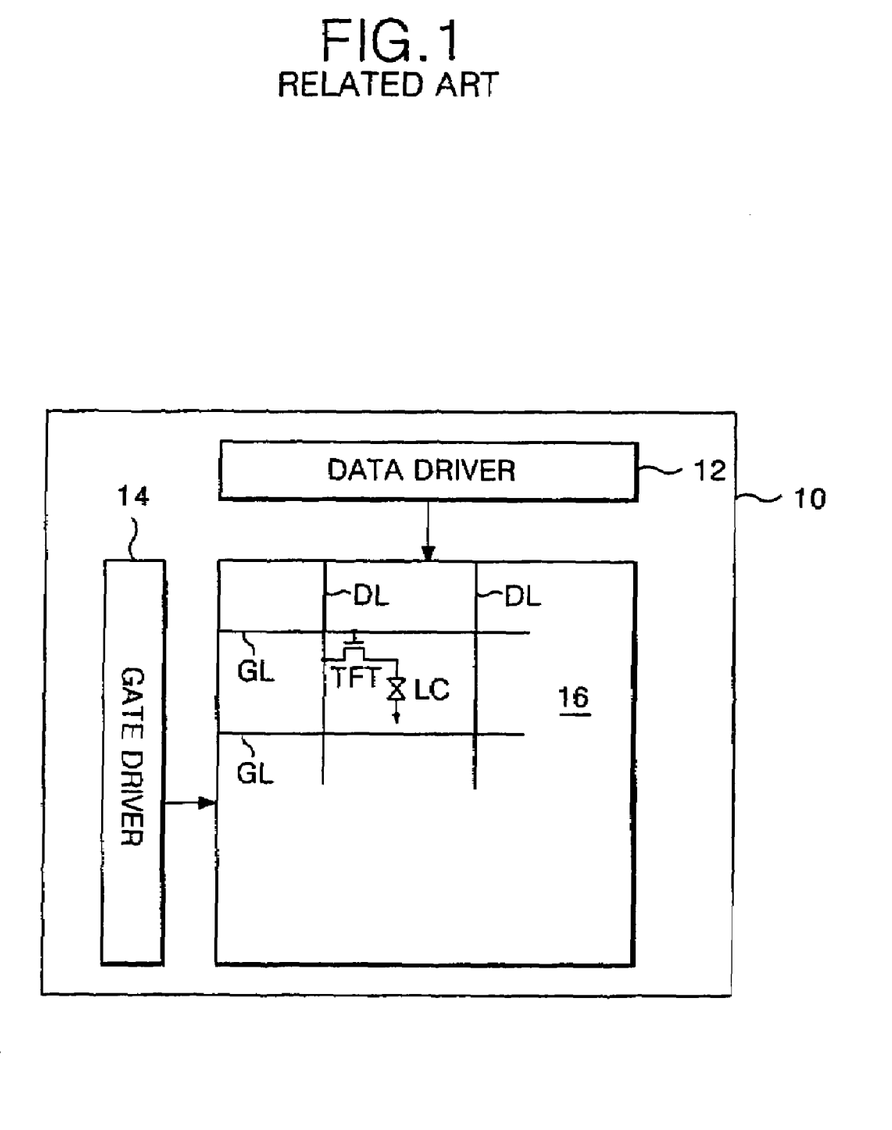
FIG. 1 is a schematic block diagram showing a configuration of a conventional polycrystalline silicon type liquid crystal display panel.

FIG. 1 schematically illustrates a configuration of a conventional liquid crystal display panel employing a polycrystalline silicon thin film transistor.

Referring to FIG. 1, the conventional liquid crystal display panel 10 includes a pixel matrix 16, a data driver 12 for driving data lines DL of the pixel matrix 16, and a gate driver 14 for driving gate lines GL of the pixel matrix 16.

The pixel matrix 16 has liquid crystal cells LC defined at crossings of the gate lines GL and the data lines DL and arranged in a matrix type, to display a picture. Each liquid crystal cell LC is a switching device connected to each crossing gate lines GL and the data lines DL and includes a thin film transistor (TFT) employing polycrystalline silicon. Because the thin film transistor TFT uses polycrystalline silicon having 100 times faster electric charge mobility than amorphous silicon, the liquid crystal cells LC are driven in a point-sequence system. The thin film transistor TFT responds to a scanning pulse from the gate line GL to charge a video signal from the data line DL, that is, a pixel signal into the liquid crystal cell LC. Thus, the liquid crystal cell LC controls a light transmittance in accordance with a charged pixel signal.

The gate driver 14 shifts a start pulse input from an external timing controller (not shown) to generate a shift pulse, and makes a level shifting of the shift pulse to apply it to the gate line GL as a scanning pulse. To this end, the gate driver 14 includes a shift register for shifting the start pulse and a level shifter for making a level shifting of the shift pulse from the shift register in order to apply it to the gate line GL as a scanning pulse.

The data driver 12 converts pixel data input from an external timing controller (not shown) into an analog pixel signal to be applied to the data line DL. To this end, the data driver 12 includes a shift register for applying a sequential sampling signal, a latch part for latching an input pixel data in response to the sampling signal and outputting the latched pixel data, and a digital-to-analog converter for converting a digital pixel data from the latch part into an analog pixel signal.

Figure 2:
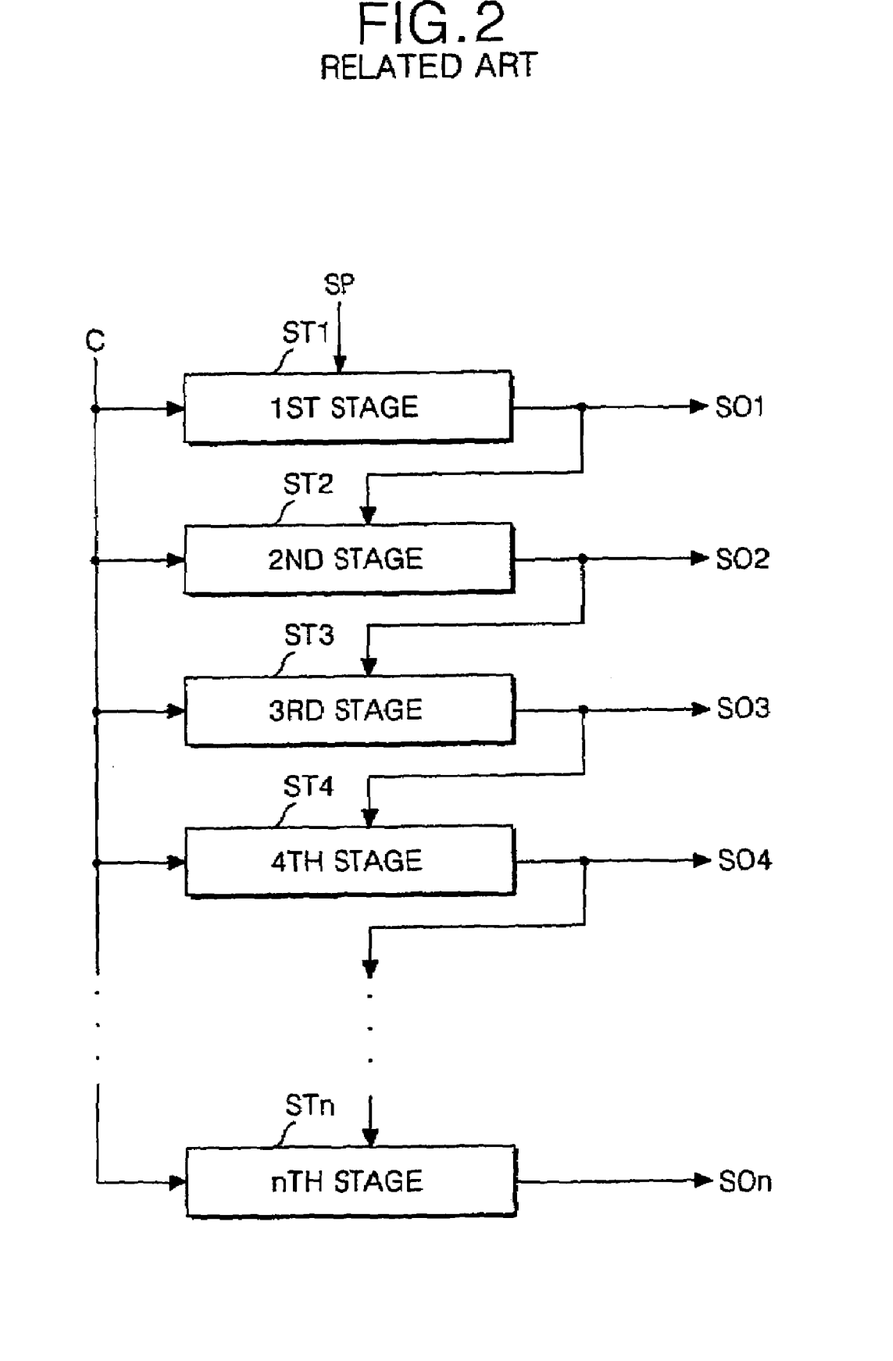
FIG. 2 is a block diagram showing a configuration of a shift register applied to the gate and data drivers shown in FIG. 1.

The gate driver 14 and the data driver 12 employ a shift register having a circuit configuration simpler than a decoder system for the purpose of generating a sequential shift pulse. As shown in FIG. 2, the shift register is comprised of a plurality of stages ST1 to STn connected, in cascade, to a start pulse (SP) input line. The plurality of stages ST1 to STn sequentially shift the start pulse SP in response to a clock signal C to generate output signals SO1 to Son. In this case, each of the second to nth stages ST2 to STn receives a pre-stage output signal as a start pulse to shift it. Thus, the shift registers generate output signals SO1 to Son such that the start pulse is sequentially shifted.

Such a shift register is largely classified into a dynamic shift register and a static shift register. The dynamic shift register has characteristics including a small number of TFT's per stage and a simple structure, but has drawbacks of a narrow frequency range and relatively large power consumption. On the other hand, the static shift register requires a large number of TFT's per stage, but has such characteristics that it can be used for a wide range of frequency bands and has improved power consumption.

It is important to provide circuitry configured with as small a number of TFT's as possible without deterioration in a special function in designing a shift register that can be built on to the liquid crystal display panel. However, the dynamic shift register has a problem in that it has a relatively poor response in the high frequency range and has relatively poor power consumption characteristics. In particular, it can malfunction due to the device characteristic of the polycrystalline silicon TFT having a relatively large leakage current.

SUMMARY OF THE INVENTION

Accordingly, the present invention is directed to a shift register for use in display devices that substantially obviates one or more of the problems due to limitations and disadvantages of the related art.

Accordingly, it is an advantage of the present invention to provide a shift register that has a simple configuration, improved response, and reduced power consumption.

In order to achieve these and other advantages of the invention, each stage of a shift register, having a plurality of stages connected to each other in cascade to be scanned in a bilateral direction, according to an embodiment of the present invention includes a charger for charging a first supply voltage into a first node in response to a clock signal; a discharger for discharging the first node in response to a first start pulse or a second start pulse; a scan direction controller connected between the charger and the discharger to discharge the first node into a different path in response to a scan direction control signal; output means for outputting any one of said first and second supply voltages as an output signal in response to a voltage at the first node; and latch means for latching said output signal using said output signal and a clock signal inverted from said clock signal to feed back the latched output signal to the first node.

In the shift register, said charger includes a first transistor for controlling a conductive path between a supply line for said first supply voltage and the first node in response to said clock signal.

Said discharger includes a second transistor for controlling a conductive path between the first node and the clock signal supply line in response to said first start pulse; and a third transistor connected, in parallel, to the second transistor to control said conductive path in response to said second start pulse.

Said scan direction controller includes a fourth transistor for controlling a conductive path between the first node and the second transistor in response to a first direction control signal; and a fifth transistor for controlling a conductive path between the first node and the third transistor in response to a second direction control signal.

Herein, said first start pulse is a forward start pulse in which an output signal of the previous stage being adjacent forwardly is inputted, and said second start pulse a backward start pulse in which an output signal of the previous stage being adjacent backwardly is inputted.

Said first direction control signal has a logical state contrary to said second direction control signal.

Said fourth transistor forms a discharge path between the first node and the second transistor when the plurality of stages is scanned forwardly, and said fifth transistor forms a discharge path between the first node and the third transistor when the plurality of stages is scanned backwardly.

Said output means includes an inverter for inverting a voltage at the first node to output it.

Said inverter includes a sixth transistor for controlling a conductive path between a supply line for said first supply voltage and an output line of the stage in response to a voltage at the Q node; and a seventh transistor for controlling a conductive path between a supply line for said second supply voltage and said output line of the stage in opposition to the sixth transistor in response to said voltage at the Q node.

Said latch means inverts and latches said output signal to feed it back into the first node.

Said latch means includes an eighth transistor for controlling a conductive path between said supply line for said first supply voltage and the first node in response to said output signal; a ninth transistor for controlling a conductive path between said supply line for said second supply voltage and the firs node in response to said output signal; a tenth transistor for controlling a conductive path between said supply line for said first supply voltage and the eighth transistor in response to said inverted clock signal; and an eleventh transistor for controlling a conductive path between said supply line for said second supply voltage and the ninth transistor in response to said clock signal.

Herein, said tenth transistor is turned on or off simultaneously with the eighth transistor, and said eleventh transistor is turned on or off simultaneously with the ninth transistor.

Said second, third, fourth, fifth, seventh, ninth and eleventh transistors have polarity characteristics contrary to said first, sixth, eighth and tenth transistors.

Said first supply voltage is larger than said second supply voltage.

Herein, odd stages of said plurality of stages use a first clock and an inverted first clock signal while even stages of said plurality of stages use a second clock and an inverted second clock signal.

Herein, said first clock signal has a phase difference of ¼ period from said second clock signal.

An output signal of each of said plurality of stages partially overlaps with an output signal of the previous stage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to exemplary embodiments of the present invention, examples of which are illustrated in the accompanying drawings.

Figure 3:
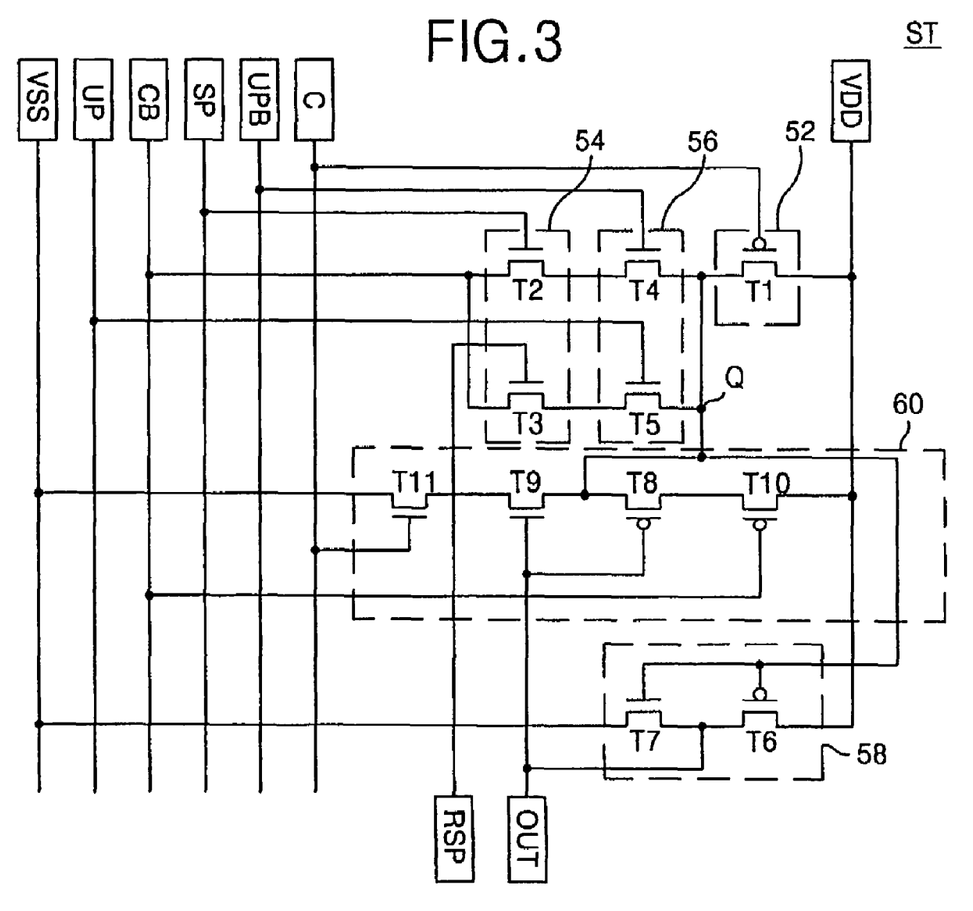
FIG. 3 is a detailed circuit diagram of one stage of a shift register according to an embodiment of the present invention.
Figure 4:
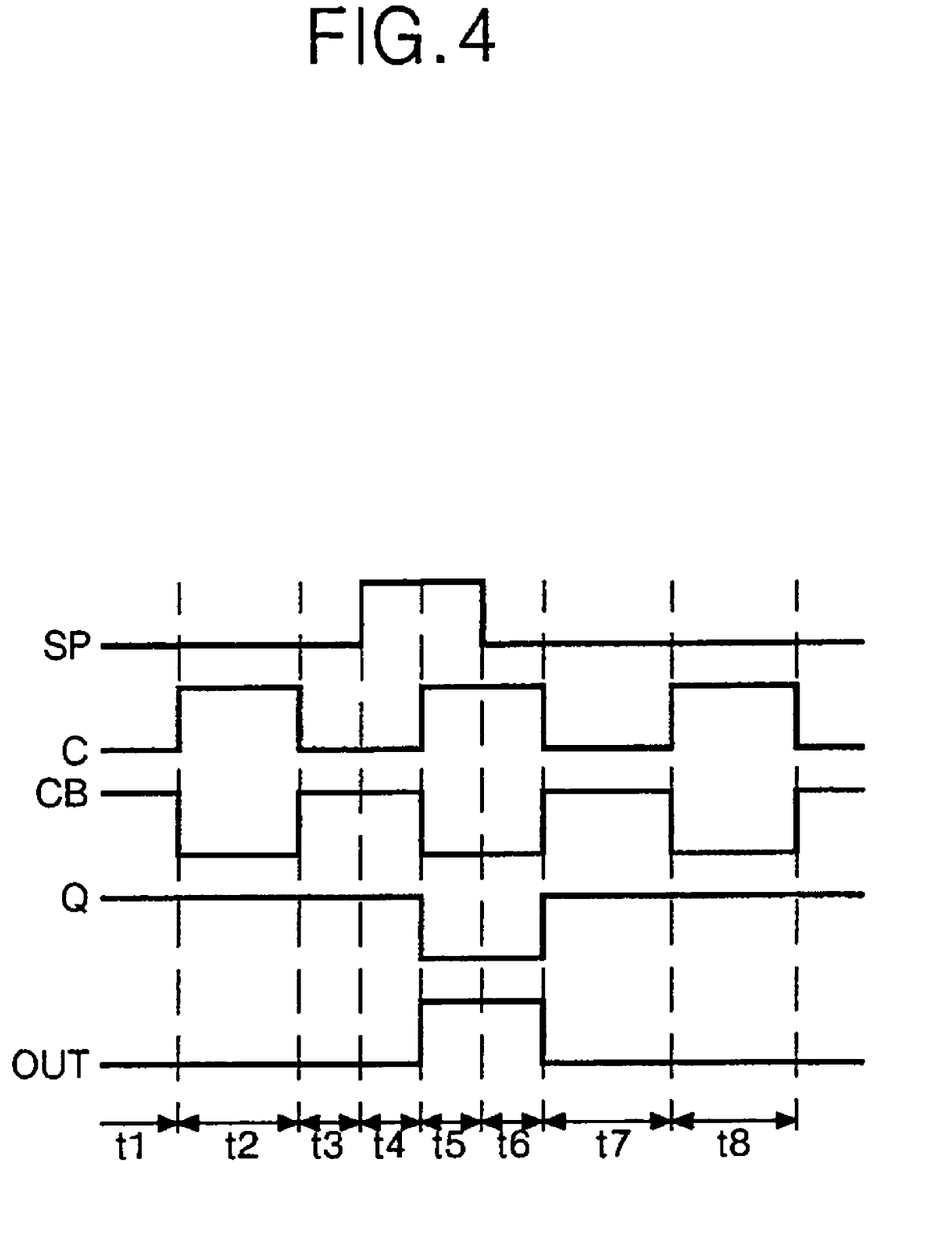
FIG. 4 is a driving waveform diagram of the stage shown in FIG. 3.

FIG. 3 is a detailed circuit diagram of one stage ST of a plurality of stages configuring a static shift register according to an exemplary embodiment of the present invention, and FIG. 4 is a driving waveform diagram of the stage ST shown in FIG. 3.

Each stage ST of the static shift register illustrated in FIG. 3 includes a charger 52 for charging a Q node in response to a clock signal C, a discharger 54 for discharging the G node in response to a forward start pulse SP or a backward start pulse RSP, a scan direction controller 56 for controlling a discharge path of the Q node according to direction control signals UP and UPB between the charger 52 and the discharger 54 to thereby control a scan direction, an inverter 58 for inverting a voltage at the Q node to output it as an output signal OUT, and a latch 60 for inverting and latching the output signal OUT to apply it to the Q node.

The charger 52 includes a first p-type transistor T1 for controlling a conductive path between a first supply voltage (VDD) line and the Q node in response to the clock signal C.

The discharger 54 includes a second n-type transistor T2 for controlling a conductive path between the Q node and a inversion clock signal (CB) line in response to a forward start pulse SP, and a third n-type transistor T3 for controlling the conductive path in response to a backward start pulse RSP.

The scan direction controller 56 includes a fourth n-type transistor T4 for controlling a conductive path between the charger 52 and the discharger 54 in response to a direction control signal, that is, an inversion backward signal UPB, and a fifth n-type transistor T5 for controlling the conductive path in response to a backward signal UP.

The inverter 58 includes a sixth p-type transistor T6 for controlling a conductive path between the first supply voltage (VDD) line and the output signal (OUT) line in response to a voltage at the Q node, and a seventh n-type transistor T7 for controlling a conductive path between the output signal (OUT) line and a second supply voltage (VSS) line in response to a voltage at the Q node.

The latch 60 includes an eighth p-type transistor T8 for controlling a conductive path between the first supply voltage (VDD) line and the Q node in response to the output voltage OUT, a ninth n-type transistor T9 for controlling a conductive path between the Q node and the second supply voltage (VSS) line in response to the output voltage OUT, a tenth p-type transistor T10 for controlling a conductive path between the first supply voltage (VDD) line and the eighth transistor T8 in response to the inversion clock signal CB, and an eleventh n-type transistor T11 for controlling a conductive path between the ninth transistor T9 and the second supply voltage (VSS) line in response to the clock signal C. Such a latch 60 inverts and latches the output signal OUT to feed it back into the Q node. Thus, when the Q node becomes a floating state, the transistors connected to the Q node can prevent the Q node from being distorted due to a leakage current.

An operation of one stage ST of the shift register having the above-mentioned configuration will be described in detail with reference to driving waveforms shown in FIG. 4.

The first supply voltage VDD supplied to the stage ST is higher than the second supply voltage VSS. An alternating current pulse in which a high state and a low state are alternated in one period is used as the clock signal C while a signal in which the clock signal C is inverted is used as the inversion clock signal CB.

First, a high-state voltage should be applied as the inversion backward signal UPB while a low-state voltage should be applied as the backward signal UP for the purpose of forward scanning. The high-state backward signal UPS allows the fourth transistor T4 to maintain a turn-on stage while the low-state backward signal UP allows the fifth transistor T5 to maintain a turn-off state. In this case, since a backward start pulse RSP remains at a low state, the third transistor T3 also maintains a turn-off state.

In a t1 period, the first transistor T1 is turned on by a low-state clock signal C while the second transistor T2 is turned off by a low-state forward start pulse SP. Thus, the first supply voltage VDD is charged, via the first transistor T1, into the Q node, which results in a high state. Further, since the high-state Q node allows the seventh transistor T7 of the inverter 58 to supply the second supply voltage VSS, the output signal OUT becomes a low state.

In a t2 period, since the first transistor T1 is turned off by the high-state clock signal C while the second transistor T2 keeps a turn-off state by the low-state forward start pulse SP, the Q node is floated into a high state. The floated high-state Q node allows the output signal OUT to remain in a low state like the above-mentioned t1 period. Further, the latch part 60 maintains the Q node at a high state by turning on the eighth and tenth transistors T8 and T10, so that it can prevent the Q node from being distorted due to a leakage current of the transistors connected thereto.

In a t3 period, the clock signal becomes a low state; the inversion clock signal CB becomes a high state; and the forward start pulse SP becomes a low state in similarity to the t1 period. Thus, the Q node is re-charged into a high state in the operation similar to the t1 period to thereby keep the output signal OUT at a low state.

In a t4 period, the clock signal C and the inversion clock signal maintain a high state and a low state, respectively, like the t3 period while the forward start pulse SP becomes a high state. Thus, the second transistor T2 is turned on to thereby apply the high-state inversion clock signal CB, via the fourth transistor T4 remaining at a turn-on state, to the Q node, so that the Q node keeps a high state. Thus, the output signal OUT keeps a low state in similarity to the t3 period.

In a t5 period, the forward start pulse SP keeps a high state, whereas the clock signal C becomes a high state and the inversion signal CB becomes a low state. Thus, the first transistor T1 is turned off while the fourth transistor T4 remains at a turn-on state. Accordingly, a voltage at the Q node is discharged, via the fourth and second transistors T4 and T2, into the low-state inversion clock signal (CB) line, thereby resulting in a low state. Further, the low-state Q node allows the sixth transistor T6 of inverter 58 to supply the first supply voltage VDD, so that the output signal OUT becomes a high state.

In a t6 period, like the t2 period, the clock signal C becomes a high state; the inversion clock signal CB becomes a low state; and the forward start pulse SP becomes a low state. Thus, since the first and second transistors T1 and T2 are turned off, the Q node is floated to a low state. The floated low-state Q node allows the output signal OUT to remain in a high state like in the above-mentioned t5 period. Further, the latch part 60 keeps the Q node at a low state by turning on the ninth and eleventh transistors T9 and T11, it can prevent the Q node from being distorted due to leakage currents of the transistors connected thereto.

In a t7 period, since the t7 period is identical to the t1 period, the Q node is re-charged into a high state, thereby allowing the output signal OUT to be a low state.

In a t8 period, since the t8 period is identical to the t2 period, the Q node is floated into a high state, thereby keeping the output signal OUT at a low state.

The stage of the shift register shown in FIG. 3 shifts a high-state forward start pulse SP in that manner to thereby output a high-state output signal OUT. In this case, a high state of the first half of the output signal OUT that may be unstable partially overlaps with a high state of the forward start pulse SP while a high state of the stable second half thereof is used as a scanning signal or a sampling signal, thereby improving response.

The stage shown in FIG. 4 allows the fourth transistor T4 to be turned off while the fifth transistor T5 remains in a turn-on state when a low-state voltage is applied as the inversion backward signal UPB and while a high-state voltage is applied as the backward signal UP for the purpose of making a backward scanning. Thus, the stage shifts a high state of the backward start pulse SP applied to the control electrode of the third transistor T3 in the above-mentioned manner to thereby output a high-state output signal OUT that partially overlaps with the backward start pulse SP.

Alternatively, the shift register shown in FIG. 4 may have n-type transistors and p-type transistors configured opposite each other.

As a result, the shift register according to the present invention allows for bilateral scanning and a simple circuit configuration. Furthermore, the shift register according to the present invention latches an output signal to feed it back into the Q node, thereby preventing the Q node from being distorted due to leakage current at a floated state.

Figure 5:
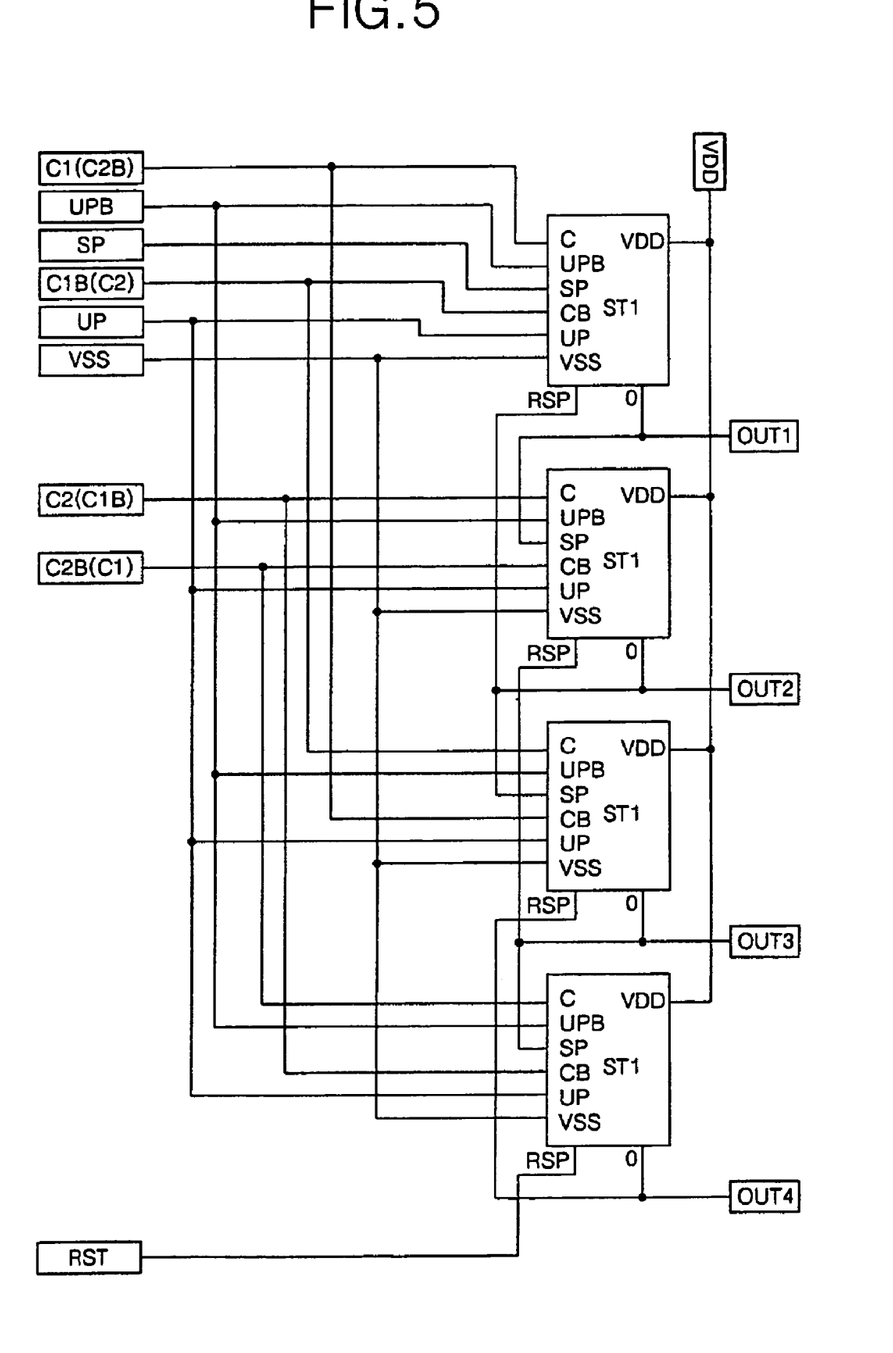
FIG. 5 is a block diagram of a four-stage shift register using the stage shown in FIG. 3.
Figure 6:
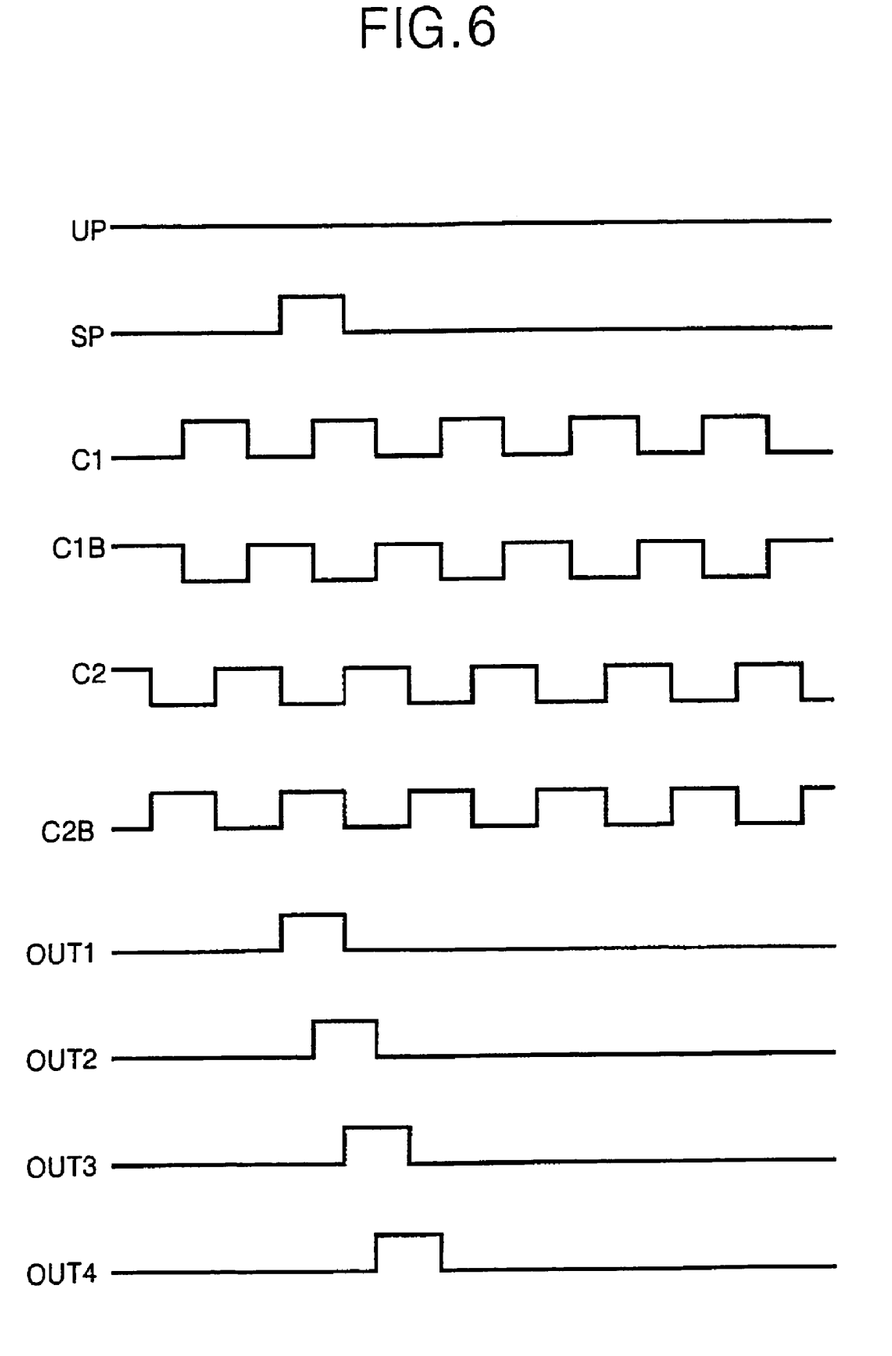
FIG. 6 is a driving waveform diagram upon a forward driving of the shift register shown in FIG. 3.

FIG. 5 is a block diagram of a four-stage shift register to which the stage shown in FIG. 3 is applied; FIG. 6 is a driving waveform diagram when the shift register shown in FIG. 5 performs forward scanning; and FIG. 7 is a driving waveform diagram when the shift register shown in FIG. 5 makes a backward scanning.

The first to fourth stages ST1 to ST4 shown in FIG. 5 are connected to each other in cascade to input an output signal OUT at the previous stage as a start pulse SP or RSP. Further, the first to fourth stages ST1 to ST4 commonly receive the first and second supply voltages VDD and VSS and the scan direction control signals UP and UPB. Each of the first to fourth stages ST1 to ST4 receives two clock signals, of four-phase clock signals C1, C1B, C2 and C2B as shown in FIG. 6 and FIG. 7, as the corresponding clock signals C and CB. More specifically, when the first to fourth stages ST1 to ST4 are scanned in a forward direction, the first and third stages ST1 and ST3 receive C1 and C1B shown in FIG. 6 as the corresponding clock signal C and CB, respectively while the second and fourth stages ST2 and ST4 receive C2 and C2B as the corresponding clock signals C and CB, respectively. On the other hand, when the first to fourth stages ST1 to ST4 are scanned in a backward direction, the first and third stages ST1 and ST3 receives C2 and C2B shown in FIG. 7 as the corresponding clock signal C and CB, respectively while the second and fourth stages ST2 and ST4 receive C1 and C1B as the corresponding clock signals C and CB, respectively. Herein, the C1 and C1B has a relationship of preceding ¼ period in comparison with the C2 and C2B, respectively.

Such first to fourth stages ST1 and ST4 are scanned in a forward direction when a scan direction control signal UP has a low state as shown in FIG. 6. More specifically, when the scan direction control signal UP has a low state, the forward start pulse SP inputted to the first stage ST1 is forwardly shifted in response to the corresponding clock signals C and CB. In this case, the second to fourth stages ST2 to ST4 receive an output signal of the previous stage as a forward start pulse SP in order to shift it. Thus, the first to fourth stages ST1 to ST4 output first to fourth output signals OUT1 to OUT4 having a high state shifted forwardly as shown in FIG. 6. Herein, each of the first to fourth output signals OUT1 to OUT4 is outputted in such a manner to overlap partially with a high state of an output signal of the previous stage, thereby allowing the high state to be used as a stable region.

Figure 7:
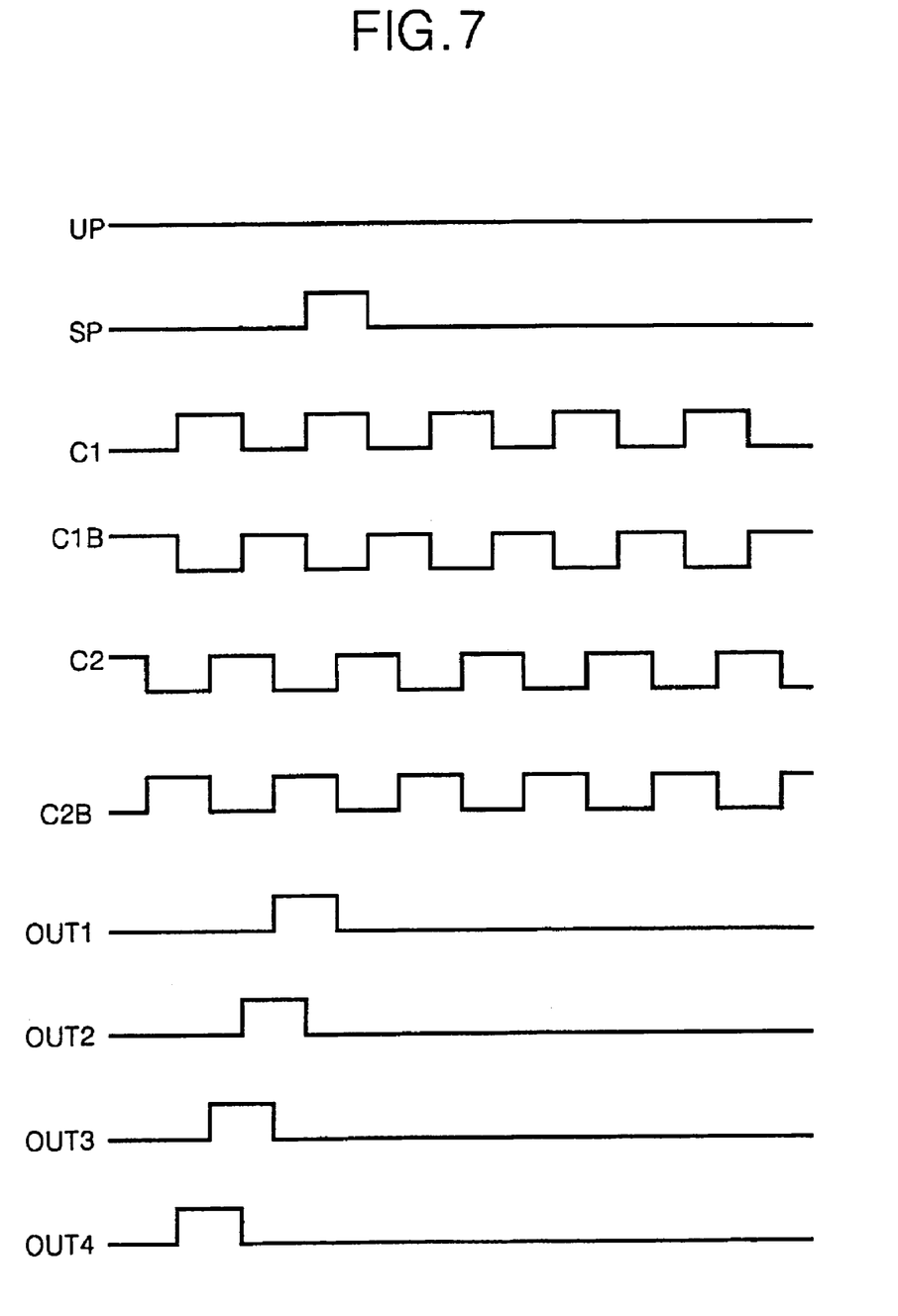
FIG. 7 is a driving waveform diagram upon a backward driving of the shift register shown in FIG. 3.

On the other hand, such first to fourth stages ST1 and ST4 are scanned in a backward direction when a scan direction control signal UP has a high state as illustrated in FIG. 7. More specifically, when the scan direction control signal UP has a high state, the backward start pulse RSP inputted to the fourth stage ST4 is shifted forward in response to the corresponding clock signals C and CB. In this case, the third to first stages ST3 to ST1 receive an output signal of the previous stage in the backward direction as a backward start pulse RSP in order to shift it. Thus, the first to fourth stages ST1 to ST4 output first to fourth output signals OUT1 to OUT4 having a high state shifted backwardly as shown in FIG. 7. Herein, each of the first to fourth output signals OUT1 to OUT4 is outputted in such a manner as to overlap partially with a high state of an output signal of the previous stage, thereby allowing the high state to be used as a stable region.

As described above, the shift register according to the present invention permits a bilateral scanning and a simple circuit configuration. Furthermore, the shift register according to the present invention latches an output signal to feed it back into the Q node, thereby preventing the Q node from being distorted due to a leakage current at a floated state.

Accordingly, the shift register according to the present invention has a higher response, so that it is suitably applicable to a data driver and a gate driver of a liquid crystal display requiring a high response It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A shift register having a plurality of stages connected to each other in cascade to be scanned in a bilateral direction, each of said plurality of stages comprising:
   a charger that charges a first supply voltage into a first node in response to a clock signal;
   a discharger that discharges the first node in response to a first start pulse or a second start pulse;
   a scan direction controller connected between the charger and the discharger to discharge the first node into a different path in response to a scan direction control signal;
   output means that outputs any one of said first and second supply voltages as an
   output signal in response to a voltage at the first node; and
   latch means that latches said output signal using said output signal and a clock signal inverted from said clock signal to feed back the latched output signal to the first node.

2. The shift register according to claim 1, wherein said charger comprises:
   a first transistor that controls a conductive path between a supply line for said first supply voltage and the first node in response to said clock signal.

3. The shift register according to claim 2, wherein said discharger comprises:
   a second transistor that controls a conductive path between the first node and the clock signal supply line in response to said first start pulse; and
   a third transistor connected, in parallel, to the second transistor to control said conductive path in response to said second start pulse.

4. The shift register according to claim 3, wherein said scan direction controller comprises:
   a fourth transistor for controlling a conductive path between the first node and the second transistor in response to a first direction control signal; and
   a fifth transistor for controlling a conductive path between the first node and the third transistor in response to a second direction control signal.

5. The shift register according to claim 4, wherein said first start pulse is a forward start pulse in which an output signal of the previous stage is input, and said second start pulse is a backward start pulse in which an output signal of the previous stage is input.

6. The shift register according to claim 5, wherein said first direction control signal has a logical state opposite to said second direction control signal.

7. The shift register according to claim 5, wherein said fourth transistor forms a discharge path between the first node and the second transistor when the plurality of stages is scanned forward, and said fifth transistor forms a discharge path between the first node and the third transistor when the plurality of stages is scanned backward.

8. The shift register according to claim 4, wherein said output means includes: an inverter for inverting a voltage at the first node.

9. The shift register according to claim 8, wherein said inverter comprises:
   a sixth transistor for controlling a conductive path between a supply line for said first supply voltage and an output line of the stage in response to a voltage at a node; and
   a seventh transistor for controlling a conductive path between a supply line for said second supply voltage and said output line of the stage in opposition to the sixth transistor in response to said voltage at the node.

10. The shift register according to claim 9, wherein said latch means inverts and latches said output signal to feed it back into the first node.

11. The shift register according to claim 9, wherein said latch means comprises:
    an eighth transistor for controlling a conductive path between said supply line for said first supply voltage and the first node in response to said output signal;
    a ninth transistor for controlling a conductive path between said supply line for said second supply voltage and the first node in response to said output signal;
    a tenth transistor for controlling a conductive path between said supply line for said first supply voltage and the eighth transistor in response to said inverted clock signal; and
    an eleventh transistor for controlling a conductive path between said supply line for said second supply voltage and the ninth transistor in response to said clock signal.

12. The shift register according to claim 11, wherein said tenth transistor is turned on or off simultaneously with the eighth transistor, and said eleventh transistor is turned on or off simultaneously with the ninth transistor.

13. The shift register according to claim 9, wherein said second, third, fourth, fifth, seventh, ninth and eleventh transistors have polarity characteristics opposite to said first, sixth, eighth and tenth transistors.

14. The shift register according to claim 1, wherein said first supply voltage is larger than said second supply voltage.

15. The shift register according to claim 1, wherein odd stages of said plurality of stages use a first clock and an inverted first clock signal while even stages of said plurality of stages use a second clock and an inverted second clock signal.

16. The shift register according to claim 15, wherein said first clock signal has a phase difference of ¼ period from said second clock signal.

17. The shift register according to claim 16, wherein an output signal of each of said plurality of stages partially overlaps with an output signal of the previous stage.

* * * * *